United States Patent
Ozawa (10) Patent No.: US 7,109,549 B2
(45) Date of Patent: Sep. 19, 2006

(54) SEMICONDUCTOR DEVICE AND METHOD OF MANUFACTURING THE SAME

(75) Inventor: Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 10/986,074

(22) Filed: Nov. 12, 2004

(65) Prior Publication Data
US 2006/0001076 A1 Jan. 5, 2006

(30) Foreign Application Priority Data
Jul. 2, 2004 (JP) ............... 2004-196975

(51) Int. Cl.
*H01L 21/336* (2006.01)
(52) U.S. Cl. .............. 257/315; 257/330; 257/316; 257/E29.129; 257/E29.135; 438/257; 438/182; 438/183
(58) Field of Classification Search .............. 257/202, 257/315–319; 438/182, 183, 256, 271, 257
See application file for complete search history.

(56) References Cited

U.S. PATENT DOCUMENTS 6,060,740 A * 5/2000 Shimizu et al. ............. 257/314

FOREIGN PATENT DOCUMENTS

| JP | 8-316348 | 11/1996 |
| JP | 2000-22008 | 1/2000 |
| JP | 2002-190538 | 7/2002 |
| JP | 2003-163290 | 6/2003 |

OTHER PUBLICATIONS

Y.Ozawa, "Nonvolatile Semiconductor Memory Cell and Method of Manufacturing the Same," U.S. Appl. No. 10/791,870, filed Mar. 4, 2004.

* cited by examiner

*Primary Examiner*—George Fourson
*Assistant Examiner*—Julio J. Maldonado
(74) *Attorney, Agent, or Firm*—Finnegan, Henderson, Farabow, Garrett & Dunner, L.L.P.

(57) ABSTRACT

Disclosed is a semiconductor device having a plurality of memory cells arranged in a first direction and a second direction perpendicular to the first direction, each memory cell comprising a first insulating film formed on a semiconductor substrate, a floating gate formed on the first insulating film, a second insulating film which includes a first portion formed on a top surface of the floating gate and a second portion formed on that side surface of the floating gate which is parallel to the first direction, and a control gate which covers the first and second portions of the second insulating film, a width in the second direction of the floating gate increasing with increasing distance from its bottom, and a width in the second direction of the second portion of the second insulating film decreasing with increasing distance from its bottom.

13 Claims, 6 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2004-196975, filed Jul. 2, 2004, the entire contents of which are incorporated herein by reference.

BACKGROUND OF THE INVENTION

1. Field of the Invention

The present invention relates to a semiconductor device and a method of manufacturing the same.

2. Description of the Related Art

In recent years, electrically erasable nonvolatile semiconductor storage devices (nonvolatile memories), such as EEPROMs (Electrically Erasable and Programmable ROMs), have been in increasing demand. Each memory cell in the nonvolatile memory is structured such that a tunnel insulating film, a floating gate, an inter-electrode insulating film and a control gate are stacked in sequence on a semiconductor substrate.

With the nonvolatile memory, to lower the operating voltage of each memory cell, it is important to increase the ratio C2/ (C1+C2), where C2 is the capacitance of the upper capacitor formed between the floating gate and the control gate and C1 is the capacitance of the lower capacitor formed between the semiconductor substrate and the floating gate.

To increase the capacitance ratio (coupling ratio), a structure such that the floating gate is made larger in the width of the top surface than in the width of the bottom surface (reverse tapered structure) and a structure such that the floating gate is covered on top and side surfaces with an inter-electrode insulating film have been proposed. However, combining these structures results in the following problems.

To obtain the abovementioned structures, it is required to form the control gate film between adjacent floating gate films processed into the reverse tapered form. However, it is difficult to completely form the control gate film in the area between the floating gate films because of their reverse tapered structure. This will lead to degraded device characteristics and lowered reliability.

For example, Japanese Unexamined Patent Publications Nos. 8-316348 and 2002-22008 describe nonvolatile semiconductor storage devices having floating gates of the reverse tapered structure but disclose no solution to the above problems.

As described above, in order to increase the coupling ratio (C2/(C1+C2)) of the upper capacitor and the lower capacitor there have been proposals to form the floating gate into the reverse tapered shape or cover the floating gate with the inter-electrode insulating film on the top and side surfaces. However, difficulties are involved in completely forming the control gate in the area between floating gates, causing degraded device characteristics and lowered reliability.

BRIEF SUMMARY OF THE INVENTION

According to a first aspect of the present invention, there is provided a semiconductor device having a plurality of memory cells arranged in a first direction and a second direction perpendicular to the first direction, each memory cell comprising: a first insulating film formed on a semiconductor substrate; a floating gate formed on the first insulating film; a second insulating film which includes a first portion formed on a top surface of the floating gate and a second portion formed on that side surface of the floating gate which is parallel to the first direction; and a control gate which covers the first and second portions of the second insulating film, a width in the second direction of the floating gate increasing with increasing distance from its bottom, and a width in the second direction of the second portion of the second insulating film decreasing with increasing distance from its bottom.

According to a second aspect of the present invention, there is provided a method of manufacturing a semiconductor device comprising: forming a first insulating film on a semiconductor substrate; forming a floating gate film on the first insulating film; patterning the floating gate film to form a plurality of extension structures which extend in a first direction; forming a second insulating film on top and side surfaces of the extension structures; forming a control gate film which covers the second insulating film; and patterning the control gate film, the second insulating film, and the floating gate film to form a floating gate and a control gate which extends in a second direction perpendicular to the first direction, a width of the extension structure increasing with increasing distance from its bottom and a width of that portion of the second insulating film which is formed on the side surface of the extension structure decreasing with increasing distance from its bottom.

BRIEF DESCRIPTION OF THE SEVERAL VIEWS OF THE DRAWING

FIGS. 4A and 4B through FIGS. 9A and 9B are schematic sectional views, in the order of steps of manufacture, of the semiconductor device according to the embodiment of the present invention;

DETAILED DESCRIPTION OF THE INVENTION

An embodiment of an electrically erasable nonvolatile semiconductor storage device will be described hereinafter with reference to the accompanying drawings. The embodiment will be described in terms of a NAND-type flash memory.

Figure 1:
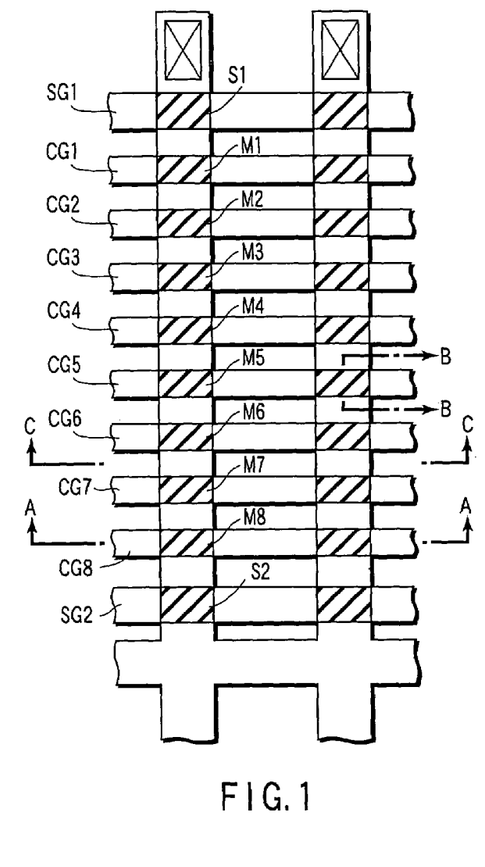
FIG. 1 is a schematic plan view of a semiconductor device according to an embodiment of the present invention.
Figure 2:
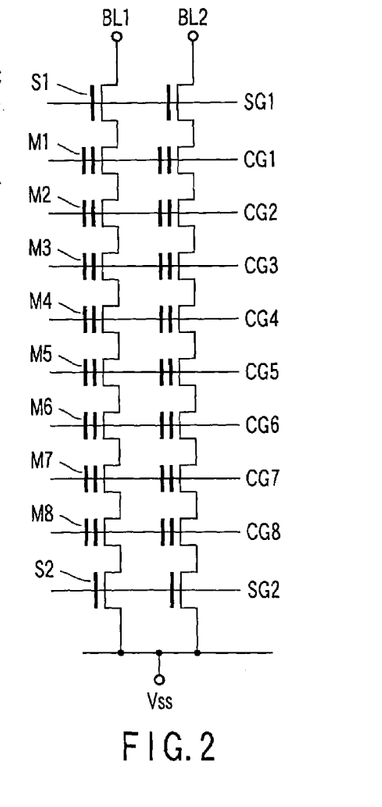
FIG. 2 is an equivalent circuit diagram of the semiconductor device shown in FIG. 1.

FIG. 1 is a schematic plan view of the NAND-type flash memory with bit lines omitted. FIG. 2 is an equivalent circuit diagram of the portion shown in FIG. 1.

As shown in FIGS. 1 and 2, each NAND cell unit comprises memory cells M1 to M8 series connected between select transistors S1 and S2. Select gate lines SG1 and SG2 are connected to the select transistors S1 and S2, respectively. Control gate lines (word lines) CG1 to CG8 are connected to the memory cells M1 to M8, respectively. Bit lines BL1 and BL2 are connected to the select transistors S1 as shown in FIG. 2. Each cell unit is illustrated as comprising of eight cells; however, this is not restrictive.

Figure 3A:
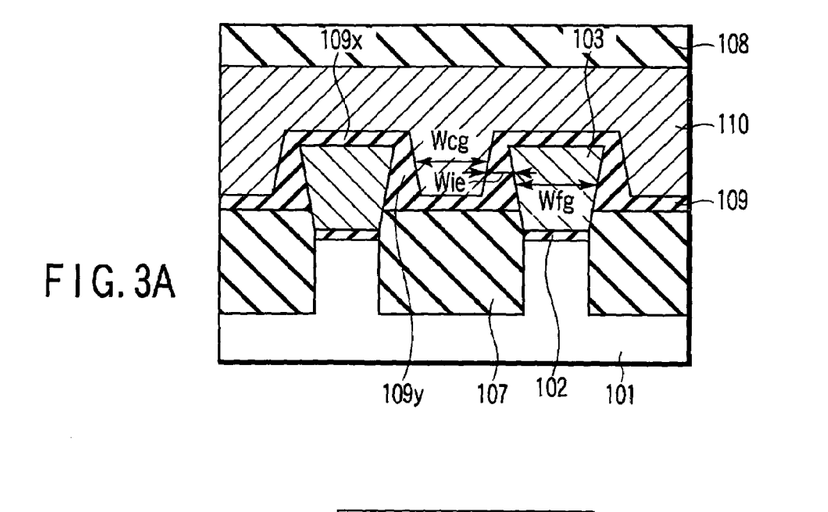
FIG. 3A is a schematic sectional view taken along line A—A of FIG. 1.
Figure 3B:
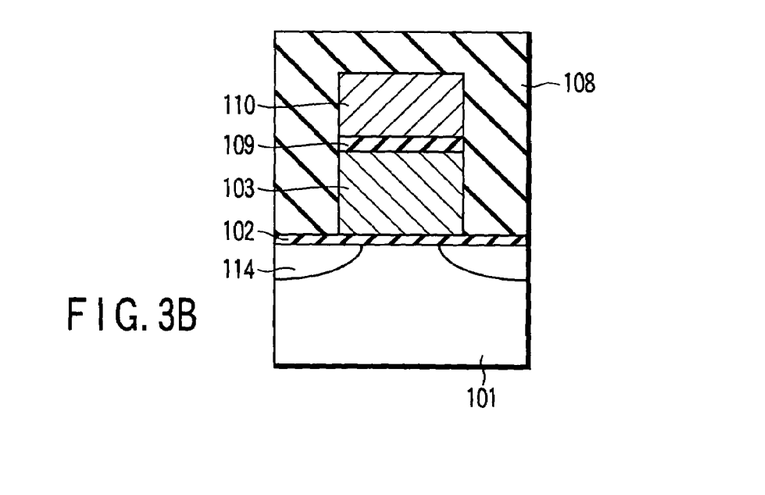
FIG. 3B is a schematic sectional view taken along line B—B of FIG. 1.
Figure 3C:
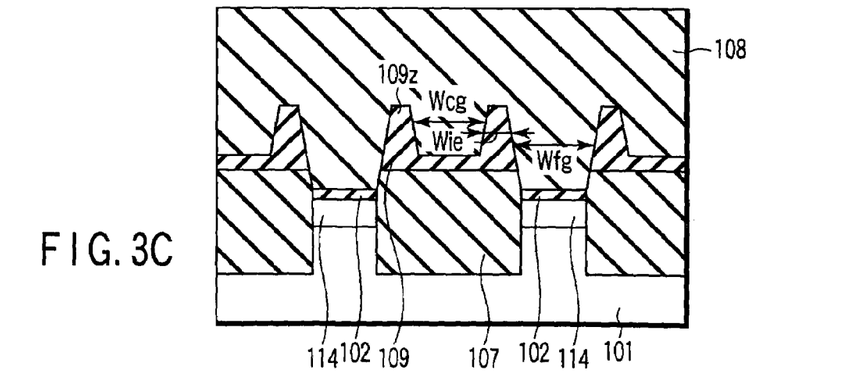
FIG. 3C is a schematic sectional view taken along line C—C of FIG. 1.

FIGS. 3A, 3B and 3C are schematic sectional views of the NAND-type flash memory shown in FIGS. 1 and 2. More specifically, FIG. 3A is a sectional view taken along line A—A of FIG. 1 (the word line direction: the second direction). FIG. 3B is a sectional view taken along line B—B of FIG. 1 (the bit line direction: the first direction). FIG. 3C is a sectional view taken along line C—C of FIG. 1 (the word line direction).

A tunnel insulating film (gate insulating film; first insulating film) 102 is formed on a silicon substrate (semiconductor substrate) 101 formed with source/drain diffusion layers 114. A floating gate 103 is formed on the tunnel insulating film 102. The floating gate 103 is capable of storing charges injected from the silicon substrate 101 through the tunnel insulating film 102. As shown in FIG. 3A, the floating gate 103 is formed so that its width in the word line direction increases with increasing distance from its bottom; that is, it is shaped into a reverse tapered form.

In the area between adjacent floating gates 103 is formed an isolation insulating film 107 to thereby form an isolation region. An interelectrode insulating film (second insulating film) 109 is formed over the floating gates 103 and the isolation insulating film 107. The floating gates 103 is covered with the interelectrode insulating film 109 on the top surface and the side surface parallel to the bit line direction. Although that portion 109x (first portion) of the interelectrode insulating film 109 which is formed on the top surface of the floating gate 103 is uniform in thickness, the width Wie of that portion 109y (second portion) of the interelectrode insulating film 109 which is formed on the side surface of the floating gate 103 decreases with increasing distance from its bottom. That is, the section of the second portion 109y of the interelectrode insulating film 109 is shaped into a tapered form. The interelectrode insulating film 109 has a portion (third portion) 109z that extends from the second portion 109y in the bit line direction as shown in FIG. 3C. The width of the third portion 109z also decreases with increasing distance from its bottom as with the second portion 109y.

A control gate (word line) 110 is formed on the interelectrode insulating film 109. The floating gates 103 are covered with the control gate 110 with the interelectrode insulating film 109 interposed therebetween. The control gate 110 has portions each of which is formed in the gap between the floating gates of the memory cells that adjoin each other in the word line direction. The gap is filled with the control gate. The width Wcg of that portion of the control gate 110 which is formed in the gap increases with increasing distance from its bottom. Memory cells that adjoin each other in the bit line direction are electrically isolated from each other by an insulating material 108.

As described above, in this embodiment, the width Wfg of the floating gate 103 is formed to increase in the direction from the bottom to the top, thus allowing the area of its top surface to be made larger than that of its bottom surface. Furthermore, the upper capacitor is formed utilizing the top and side surfaces of the floating gate 103, thus allowing the area of the upper capacitor to be increased. Therefore, the capacitance ratio (coupling ratio) of the memory cell can be increased, thus allowing the operating voltages (write and erase voltages) of the memory cell to be lowered.

Moreover, the width Wie of that portion 109y of the interelectrode insulating film 109 which is formed on the side surface of the floating gate 103 decreases in the direction from the bottom to the top, thus allowing the control gate 110 to be surely formed in the gap between adjacent floating gates.

Thus, the present embodiment allows the capacitance ratio of the memory cell to be increased and ensures that the control gate is formed between adjacent floating gates, providing a nonvolatile semiconductor storage device which has excellent characteristics and high reliability.

Figure 18:
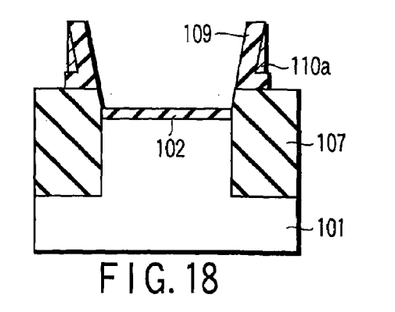
FIG. 18 is a diagram for use in explanation of a comparative example.

In addition, in the present embodiment, the width of the third portion 109z of the interelectrode insulating film 109 decreases with increasing distance from its bottom as is the case with the second portion 109y as shown in FIG. 3C. If the width of the third portion 109z were constant, part of the control gate film would remain on the outer wall of the interelectrode insulating film 109 in patterning the control gate film. As a result, as shown in a comparative example of FIG. 18, the remnants 110a of the control gate film would cause short-circuiting of the control gates of memory cells that adjoin each other in the bit line direction. In the present embodiment, such remnants of the control gate film are not produced, thus preventing the control gates from becoming short-circuited. For this reason, malfunctions of memory cells due to short-circuiting of the control gates can be prevented.

A method of manufacturing the semiconductor device of the present embodiment will be described hereinafter with reference to FIGS. 4A and 4B through FIGS. 9A and 9B. FIGS. 4A through 9A are sectional views, in the order of steps of manufacture, of the semiconductor device taken along line A—A of FIG. 1 (the word line direction) and FIGS. 4B through 9B are sectional views, in the order of steps of manufacture, of the semiconductor device taken along line B—B of FIG. 1 (the bit line direction).

Figure 4A:
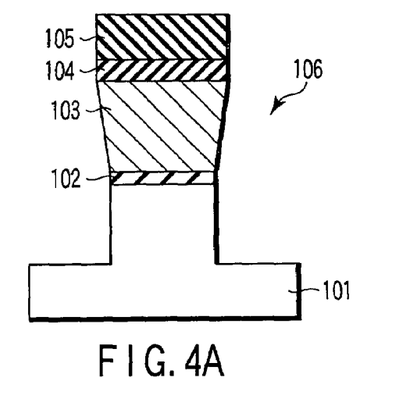
Figure 4B:
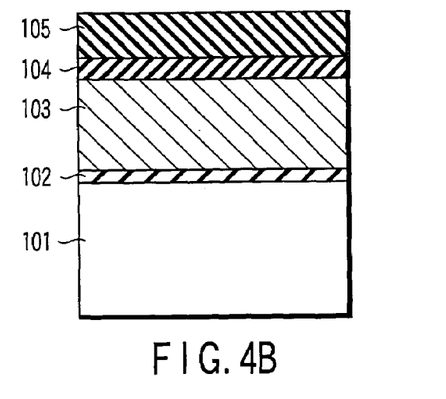

First, as shown in FIGS. 4A and 4B, the tunnel insulating film 102 of 10 nm in thickness is formed as the gate insulating film (first insulating film) on the surface of the silicon substrate 101 doped with impurities by means of thermal oxidation. Then, a phosphorous-doped polycrystalline silicon film of 150 nm in thickness is deposited as the floating fate film 103 by means of low-pressure CVD (chemical vapor deposition). After that, a CMP (chemical mechanical polishing) stopper film 104 and an RIE (reactive ion etching) mask film 105 are deposited in sequence by means of low-pressure CVD. Though not shown, a resist pattern that extends in the bit line direction is formed on the mask film 105.

Next, using the resist pattern as a mask, the mask film 105 and the stopper film 104 are etched by means of RIE. After the resist pattern has been removed, using the mask film 105 as a mask the polycrystalline silicon film 103 is processed into a reverse tapered form by means of RIE. Then, the exposed areas of the tunnel insulating film 102 and the silicon substrate 101 are sequentially etched to form isolation trenches 106 of 150 nm in depth. To process the polycrystalline silicon film 103 into a reverse tapered form, the substrate is subjected to a lengthy etching operation using a mixed gas of hydrogen bromide (HBr), chlorine ($Cl_2$), and oxygen ($O_2$) as an etching gas. In this manner, a plurality of extension structures that are made of the polycrystalline silicon film 103 processed into the reverse tapered form and extend in the bit line direction is formed.

Figure 5A:
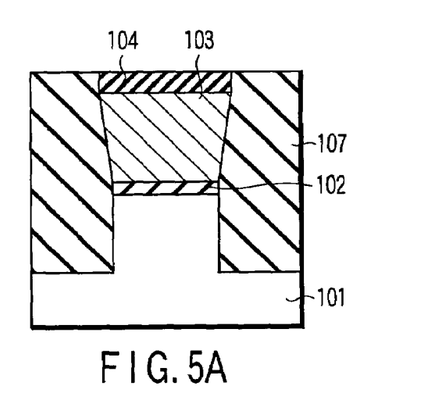
Figure 5B:
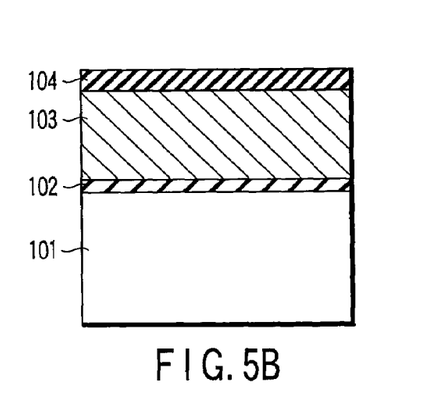

Next, as shown in FIGS. 5A and 5B, a silicon oxide film (not shown) of 5 nm in thickness is formed on the exposed surface of the silicon substrate 101 by means of thermal oxidation and a silicon oxide film of 400 nm in thickness acting as the isolation insulating film 107 is then formed through coating techniques. The isolation trench 106 is completely filled with this silicon oxide film. After that, the excess silicon oxide film 107 and the mask film 105 are removed by CMP, whereby the surface is planarized. At this point, the surface of the stopper film 104 is exposed.

Figure 6A:
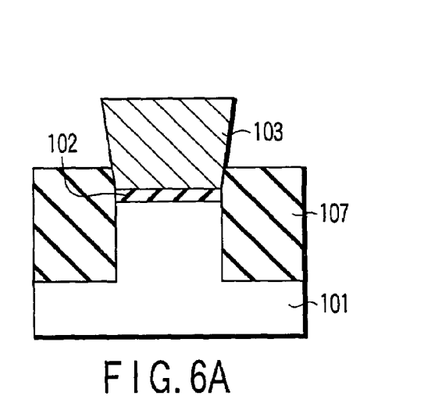
Figure 6B:
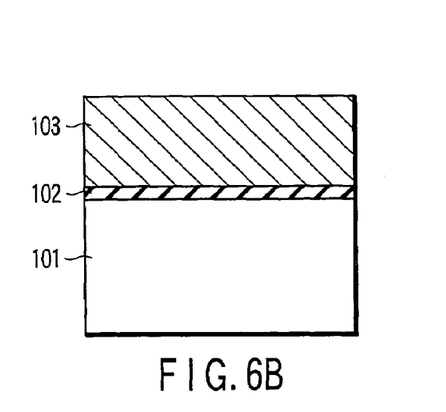

Next, as shown in FIGS. 6A and 6B, the exposed stopper film 104 is etched away by a solution of phosphoric acid. Further, the exposed portions of the silicon oxide film 107 are etched away by a solution of dilute hydrofluoric acid to expose a portion of the sidewall of the polycrystalline silicon film 103. The height of the sidewall is 100 nm.

Figure 7A:
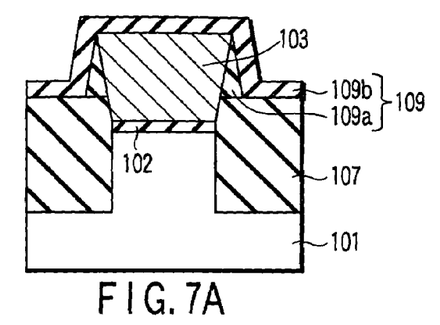
Figure 7B:
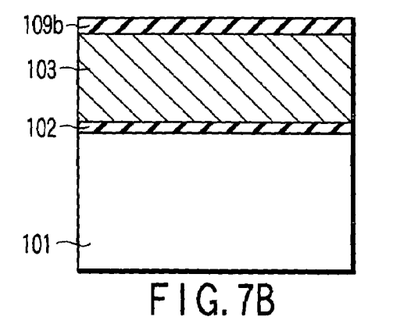

Next, as shown in FIGS. 7A and 7B, a silicon oxide film is deposited over the entire surface by means of low-pressure CVD. After that, the silicon oxide film formed on the top surface of each of the polycrystalline silicon film 103 and the isolation insulating film 107 is etched away by means of RIE (etchback RIE) to leave the silicon oxide film 109a only on the sidewall of the polycrystalline silicon film 103. At this point, the etchback RIE conditions are set so that the silicon oxide film 109a left on the sidewall of the polycrystalline silicon film 103 is shaped into a tapered form as shown in FIG. 7A. Next, a composite film 109b of silicon oxide/silicon nitride/silicon oxide (ONO) is formed with a thickness of 15 nm over the entire surface by means of low-pressure CVD. At this point, the sidewall of the ONO film 109b is also shaped into a tapered form to conform to the side of the silicon oxide film 109a.

In this manner, the surface of the polycrystalline silicon film 103 is covered with the interelectrode insulating film 109 formed from the silicon oxide film 109a and the ONO film 109b. On the sidewall of the polycrystalline silicon film 103 are formed an inside film portion formed of the silicon oxide film 109a and an outside film portion formed of the ONO film 109b. Since the width of the inside film portion 109a decreases in the direction from the bottom to the top, the width of the portion of the interelectrode insulating film 109 formed on the sidewall of the polycrystalline silicon film 103 also decreases from bottom to top.

Figure 8A:
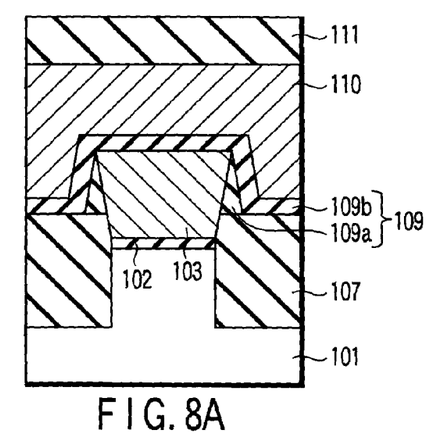
Figure 8B:
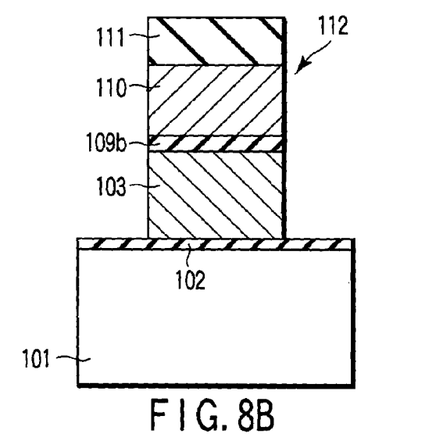

Next, as shown in FIGS. 8A and 8B, as the control gate film 110 a composite film of polycrystalline silicon and tungsten silicide is formed with a thickness of 100 nm by means of low-pressure CVD. Since the sidewall of the interelectrode insulating film 109 is tapered, the control gate film 110 can be formed surely in the area between adjacent floating gates 103.

The polycrystalline silicon film forming the control gate film 110 is doped with impurities. The doping of impurities may be performed by first depositing a non-doped polycrystalline silicon film and then implanting impurity ions into that film. In this case, since the side of the interelectrode insulating film 109 is tapered, impurity ions will not be interrupted by it upon implantation. Thus, the impurity ions can be implanted with certainty into the polycrystalline silicon film.

Next, an RIE mask film 111 is deposited by low-pressure CVD. After that, using a resist pattern (not shown) that extends in the word line direction as a mask, the mask film 111, the control gate film 110, the interelectrode insulating film 109, and the floating gate film 103 are etched in sequence by means of RIE. Thereby, a plurality of stacked cell structures, each formed of the control gate 110, the interelectrode insulating film 109, the floating gate 103, and the tunnel insulating film 102, is formed, adjacent cell structures being isolated from each other by a gap 112.

Figure 10:
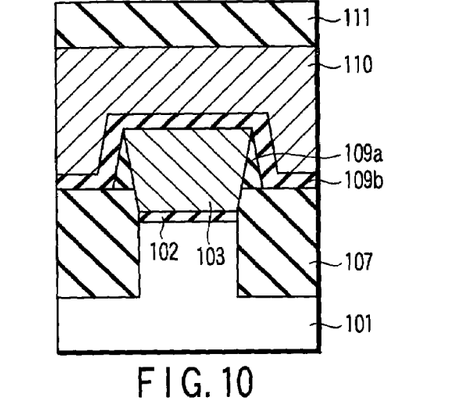
FIGS. 10 through 13 are schematic sectional views illustrating the detailed steps in FIGS. 8A and 8B.
Figure 11:
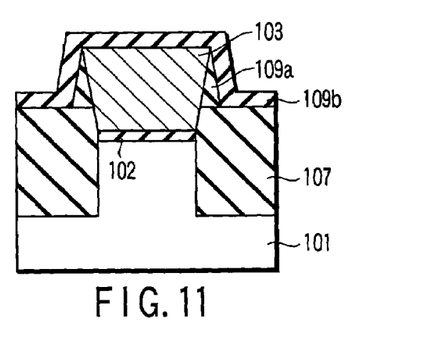
Figure 12:
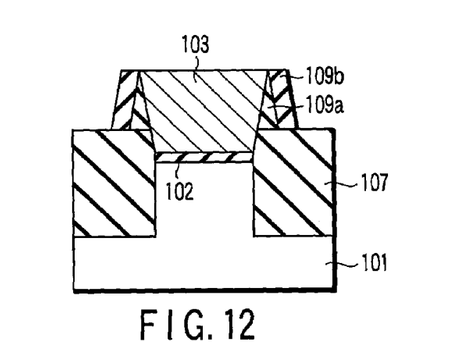
Figure 13:
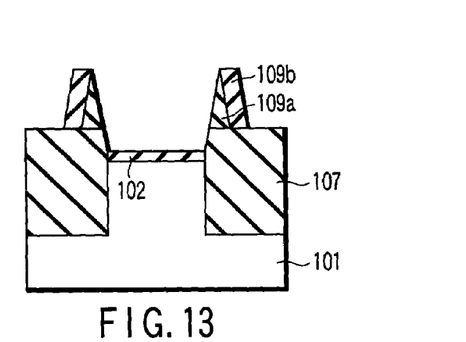

FIGS. 10 through 13 illustrate etching steps involved in forming the stacked cell structures and correspond to sectional views taken along line C—C in FIG. 1. After the mask film 111 has been formed as shown in FIG. 10, the mask film 111 and the control gate film 110 are etched, thereby obtaining the structure shown in FIG. 11. Subsequently, the ONO film 106 undergoes anisotropic etching with the result that it is left only on the sidewall of the floating gate film 103 as shown in FIG. 12. Next, the floating gate film 103 is etched away as shown in FIG. 13. As a result, the silicon oxide film 109a and the ONO film 109b are left in the area between adjacent stacked cell structures, but the control gate film 110 has been removed with certainty because the side of the ONO film 109b is tapered upward. That is, the control gate film 110 is not left on the side surface of the ONO film 109b.

Figure 9A:
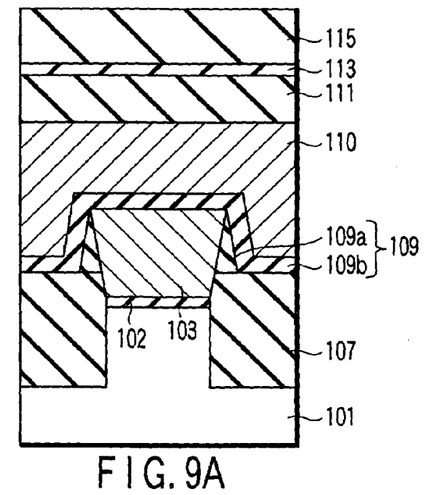
Figure 9B:
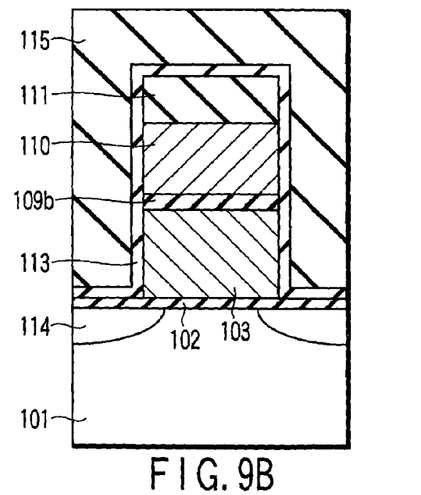

Next, as shown in FIGS. 9A and 9B, a silicon oxide film 113 of 10 nm in thickness is formed using thermal oxidation and low-pressure CVD in combination. After that, cell diffusion layers (source/drain diffusion layers) 114 are formed by ion implantation. Further, a BPSG film as an interlayer insulating film 115 is formed by means of low-pressure CVD. After that, interconnection layers and so on are formed through conventional methods to complete a nonvolatile semiconductor storage device.

As described above, the manufacturing method can offer such various excellent advantages as have been described already and allows a nonvolatile semiconductor storage device having excellent characteristics and high reliability to be obtained.

Figure 14:
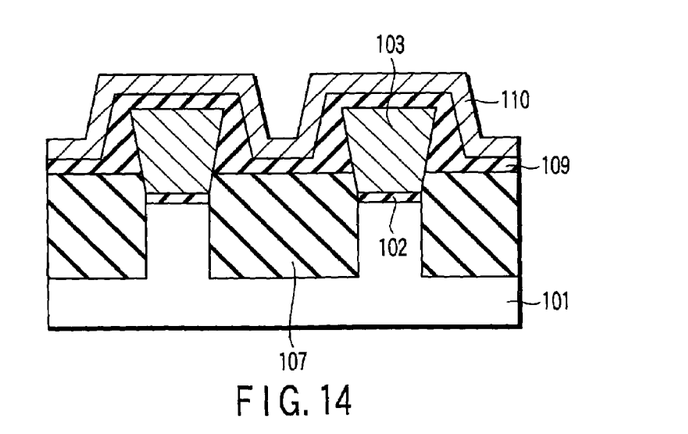
FIG. 14 is a schematic sectional view illustrating a modification of the control gate in the embodiment of the present invention.

Although the embodiment has been described as forming the control gate 110 so as to fill up the gap between adjacent floating gates 103, the control gate 110 may be formed along the surface of the interelectrode insulating film 109 as shown in FIG. 14.

In the embodiment, the inclination of the side of each of the floating gate 103, the interelectrode insulating film 109 and the control gate 110 is made constant; however, this is not restrictive.

Figure 15A:
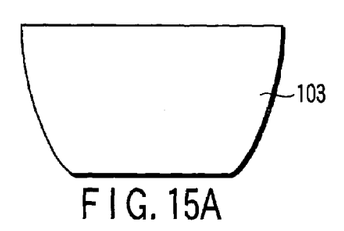
FIGS. 15A, 15B and 15C are schematic sectional views illustrating modifications of the floating gate in the embodiment of the present invention.
Figure 15B:
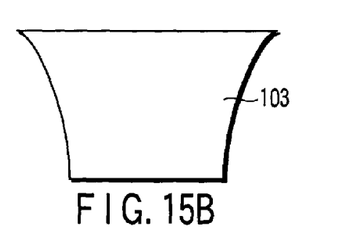
Figure 15C:
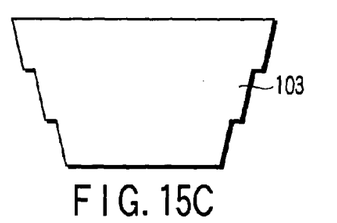

FIGS. 15A, 15B and 15C illustrate modifications of the sectional shape of the floating gate 103. As shown in FIGS. 15A and 15B, the inclination of the side surface of the floating gate 103 may be set to gradually increase or decrease with increasing distance from the bottom. Alternatively, as shown in FIG. 15C, the floating gate 103 may be formed to have a step-like side. In either case, it is possible to provide the same advantages as the embodiment described above.

Figure 16A:
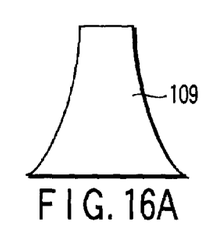
FIGS. 16A, 16B and 16C are schematic sectional views illustrating modifications of the interelectrode insulating film in the embodiment of the present invention.
Figure 16B:
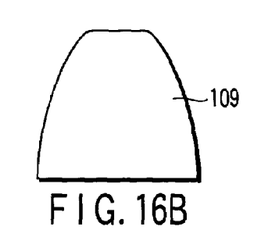
Figure 16C:
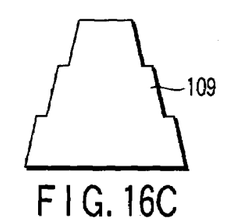

FIGS. 16A, 16B and 16C illustrate modifications of the sectional shape of that portion of the interelectrode insulating film 109 which is formed on the side of the floating gate 103. As shown in FIGS. 16A and 16B, the inclination of the side of the interelectrode insulating film 109 may be made to gradually increase or decrease with increasing distance from the bottom. Alternatively, as shown in FIG. 16C, the interelectrode insulating film 109 may be formed to have a step-like side. In either case, it is possible to provide the same advantages as the embodiment described above.

Figure 17A:
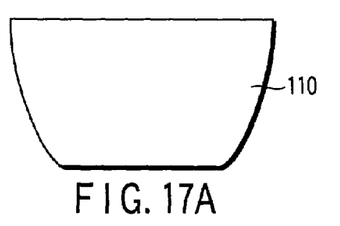
FIGS. 17A, 17B and 17C are schematic sectional views illustrating modifications of the control gate in the embodiment of the present invention.
Figure 17B:
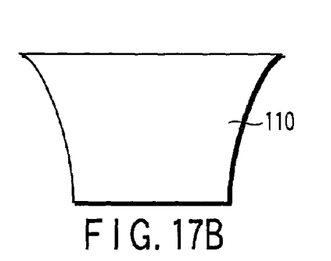
Figure 17C:
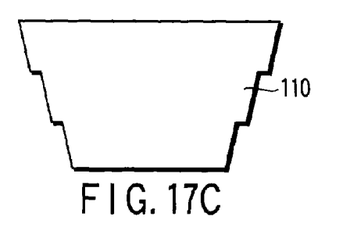

FIGS. 17A, 17B and 17C illustrate modifications of the sectional shape of that portion of the control gate 110 which is formed in the area between adjacent floating gates 103. As shown in FIGS. 17A and 17B, the inclination of the side of the control gate 110 may be made to gradually increase or decrease with increasing distance from the bottom. Alternatively, as shown in FIG. 17C, the control gate 110 may be formed to have a step-like side. In either case, it is possible to provide the same advantages as the embodiment described above.

As can be seen from the diagrams, the structures shown in FIGS. 15A, 16A and 17A may be used in combination. Likewise, the structures shown in FIGS. 15B, 16B and 17B may be used in combination. The same applies to the structures shown in FIGS. 15C, 16C and 17C.

Although the above embodiment has been described in terms of a NAND-type memory, the principles of the embodiment are equally applicable to a NOR-type memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device having a plurality of memory cells arranged in a first direction and a second direction perpendicular to the first direction, each memory cell comprising:
a first insulating film formed on a semiconductor substrate;
a floating gate formed on the first insulating film;
a second insulating film which includes a first portion formed on a top surface of the floating gate and a second portion formed on that side surface of the floating gate which is parallel to the first direction; and
a control gate which covers the first and second portions of the second insulating film,
a width in the second direction of the floating gate increasing with increasing distance from its bottom, and a width in the second direction of the second portion of the second insulating film decreasing with increasing distance from its bottom.

2. The semiconductor device-according to claim 1, wherein the control gate has a portion formed between the floating gates of the memory cells adjacent to each other in the second direction.

3. The semiconductor device according to claim 2, wherein a width in the second direction of that portion of the control gate which is formed between the floating gates increases with increasing distance from its bottom.

4. The semiconductor device according to claim 1, wherein the second insulating film further includes a third portion which extends from the second portion in the first direction, a width in the second direction of the third portion decreasing with increasing distance from its bottom.

5. The semiconductor device according to claim 1, wherein the second portion of the second insulating film includes an inner portion which is in contact with that side surface of the floating gate which is parallel to the first direction and an outer portion formed on the inner portion.

6. The semiconductor device according to claim 5, wherein a width in the second direction of the inner portion decreases with increasing distance from its bottom.

7. The semiconductor device according to claim 5, wherein the outer portion extends from the first portion of the second insulating film.

8. The semiconductor device according to claim 1, wherein the floating gate is capable of storing charges injected from the semiconductor substrate through the first insulating film.

9. The semiconductor device according to claim 1, wherein the control gate includes a semiconductor film which contains dopant impurities.

10. The semiconductor device according to claim 1, wherein an inclination of that side surface of the second portion of the second insulating film which is parallel to the first direction gradually increases with increasing distance from its bottom.

11. The semiconductor device according to claim 1, wherein an inclination of that side surface of the second portion of the second insulating film which is parallel to the first direction gradually decreases with increasing distance from its bottom.

12. The semiconductor device according to claim 1, wherein that side surface of the second portion of the second insulating film which is parallel to the first direction is formed like stairs.

13. A semiconductor device having a NAND-type memory structure and having a plurality of memory cells arranged in a first direction and a second direction perpendicular to the first direction, each memory cell comprising:
a first insulating film formed on a semiconductor substrate;
a floating gate formed on the first insulating film;
a second insulating film which includes a first portion formed on a top surface of the floating gate and a second portion formed on that side surface of the floating gate which is parallel to the first direction; and
a control gate which covers the first and second portions of the second insulating film,
a width in the second direction of the floating gate increasing with increasing distance from its bottom, and a width in the second direction of the second portion of the second insulating film decreasing with increasing distance from its bottom.

* * * * *